United States Patent
Jeon et al.

(10) Patent No.: US 12,442,523 B2
(45) Date of Patent: Oct. 14, 2025

(54) LIGHTING DEVICE USING COMBINED POWER GENERATION

(71) Applicants: Ok Ja Jeon, Suwon-si (KR); Seung Won Seo, Suwon-si (KR); Xue Bin Yin, Suwon-si (KR); Yoon Ju Kook, Ansan-si (KR); Bong Hyoung Kim, Gwangju (KR)

(72) Inventors: Ok Ja Jeon, Suwon-si (KR); Seung Won Seo, Suwon-si (KR); Xue Bin Yin, Suwon-si (KR); Yoon Ju Kook, Ansan-si (KR); Bong Hyoung Kim, Gwangju (KR)

( * ) Notice: Subject to any disclaimer, the term of this patent is extended or adjusted under 35 U.S.C. 154(b) by 185 days.

(21) Appl. No.: 18/305,870

(22) Filed: Apr. 24, 2023

(65) Prior Publication Data

US 2024/0003523 A1   Jan. 4, 2024

(30) Foreign Application Priority Data

Jul. 4, 2022 (KR) .......................... 10-2022-0081946

(51) Int. Cl.
*F21V 23/00* (2015.01)
*F03D 9/00* (2016.01)
(Continued)

(52) U.S. Cl.
CPC ............ *F21V 23/003* (2013.01); *F03D 9/007* (2013.01); *F21S 9/03* (2013.01); *F21S 9/037* (2013.01);
(Continued)

(58) Field of Classification Search
CPC ........ F21V 23/003; F21V 23/02; F21V 29/60; H02S 10/30; H10N 19/00; F03D 9/007; F21S 9/03; F21S 9/037
See application file for complete search history.

(56) References Cited

U.S. PATENT DOCUMENTS 7,937,955 B2 * 5/2011 Tsao ....................... F25B 27/00
290/44
8,651,704 B1 * 2/2014 Gordin ..................... F21V 29/60
362/373
(Continued)

FOREIGN PATENT DOCUMENTS

| KR | 10-2010-0138674 A | 12/2010 |
| KR | 10-2017-0037309 A | 4/2017 |
| WO | 2022/029889 A1 | 2/2022 |

OTHER PUBLICATIONS

Notice of Allowance dated Sep. 13, 2023 in U.S. Appl. No. 18/302,994.

*Primary Examiner* — Bryon T Gyllstrom
(74) *Attorney, Agent, or Firm* — Saliwanchik, Lloyd & Eisenschenk

(57) ABSTRACT

Proposed is a lighting device using combined power generation. Particularly, the lighting device using combined power generation includes a first power generation part including a first thermoelectric element whose first surface has a high temperature part formed by solar heat, the first power generation part being configured to generate electrical energy by using the first thermoelectric element, a second power generation part including a second thermoelectric element whose first surface has a high temperature part formed by heat generated from an LED module, the second power generation part being configured to generate electrical energy by using the second thermoelectric element, and a cooling part which is provided between the first power generation part and the second power generation part and simultaneously cools a second surface of each of the first thermoelectric element and the second thermoelectric element.

3 Claims, 7 Drawing Sheets

(51) Int. Cl.
  *F21S 9/03*   (2006.01)
  *F21V 23/02*  (2006.01)
  *F21V 29/60*  (2015.01)
  *H01L 25/075* (2006.01)
  *H02S 10/30*  (2014.01)
  *H10N 19/00*  (2023.01)

(52) U.S. Cl.
  CPC .............. *F21V 23/02* (2013.01); *F21V 29/60* (2015.01); *H02S 10/30* (2014.12); *H10N 19/00* (2023.02); *F05B 2220/708* (2013.01); *H01L 25/0753* (2013.01)

(56) References Cited

U.S. PATENT DOCUMENTS

| | | | | |
|---|---|---|---|---|
| 2012/0235579 A1* | 9/2012 | Chemel | .................. | F21V 15/01 |
| | | | | 315/152 |
| 2012/0268936 A1* | 10/2012 | Pickard | ................ | F21V 29/777 |
| | | | | 362/249.02 |
| 2016/0146507 A1* | 5/2016 | Johnson | ................. | F24S 50/20 |
| | | | | 126/714 |
| 2019/0068117 A1* | 2/2019 | Valinejadshoubi | ..... | H02S 20/22 |
| 2019/0379178 A1* | 12/2019 | Muramatsu | ............ | G02B 7/008 |
| 2021/0059123 A1* | 3/2021 | Lys | .................... | F21V 23/0442 |

\* cited by examiner (a)

(b)

(c)

410(400)

(a)

410(400)

(b)

410(400)

(c)

LIGHTING DEVICE USING COMBINED POWER GENERATION

CROSS REFERENCE TO RELATED APPLICATION

The present application claims priorities to Korean Patent Application No. 10-2022-0081946, filed Jul. 4, 2022 and 10-2023-0035903, deemed to have been filed Jul. 4, 2022 the entire contents of which are incorporated herein for all purposes by this reference.

BACKGROUND OF THE INVENTION

Field of the Invention

The present disclosure relates generally to a lighting device using combined power generation. More particularly, the present disclosure relates to a lighting device which can save energy by using power generation through solar heat and heat generated from an LED.

Description of the Related Art

In general, a lighting device such as a street light, a park light, a flood light, etc. is equipped with an LED module for light emission, and when the LED module receives power, the LED module generates heat while emitting light and thus is configured to discharge heat through a heat sink to protect the LED module so that the lifespan of the LED module is increased.

In addition, along with the development of technology, in terms of energy saving, a lighting device using power generation through solar power has recently appeared. Such a lighting device collects sunlight through a solar cell panel during the day to generate electricity and stores the generated electricity so that the electricity is supplied to the LED module at night.

However, when a sufficient amount of electricity is not produced during the day due to cloudy, rainy, or snowy weather, the lighting device is required to use external power at night, and during the night time, only consumes electricity, but cannot produce electricity, so the lighting device does not have a great energy saving effect.

DOCUMENT OF RELATED ART (Patent Document 1) Korean Patent Application Publication No. 10-2010-0138674 "ILLUMINATOR WITH THERMOELECTRIC COOLING MODULE"

SUMMARY OF THE INVENTION

Accordingly, the present disclosure has been made keeping in mind the above problems occurring in the related art, and the present disclosure is intended to propose a lighting device using combined power generation that can maximize an energy saving effect by generating electricity not only during the day but also at night by using power generation through solar heat and heat generated from an LED.

In order to achieve the above objective, according to one aspect of the present disclosure, there is provided a lighting device using combined power generation, the lighting device including: a first power generation part including a first thermoelectric element whose first surface has a high temperature part formed by solar heat, the first power generation part being configured to generate electrical energy by using the first thermoelectric element; a second power generation part comprising a second thermoelectric element whose first surface has a high temperature part formed by heat generated from an LED module, the second power generation part being configured to generate electrical energy by using the second thermoelectric element; and a cooling part which is provided between the first power generation part and the second power generation part and simultaneously cools a second surface of each of the first thermoelectric element and the second thermoelectric element.

In addition, the first power generation part may further include: a first cooling plate configured such that the second surface of the first thermoelectric element is located at an adjacent upper side of the first cooling plate and the cooling part is located at an adjacent lower side of the first cooling plate, and the second power generation part may further include: a second cooling plate configured such that the cooling part is located at an adjacent upper side of the second cooling plate and the second surface of the second thermoelectric element is located at an adjacent lower side of the second cooling plate.

Additionally, the first power generation part may further include a first heat collection plate which is provided at an adjacent upper side of the first thermoelectric element and collects heat from the sun, and the second power generation part may further include a second heat collection plate which is provided between a first surface of the second thermoelectric element and the LED module and collects heat generated from the LED module.

In addition, the cooling part may be configured to be cooled by air introduced thereinto and discharged therefrom, and inlet and outlet through which the air is introduced and discharged may be formed by protruding to be inclined downward toward the outside at at least one side of the cooling part.

Furthermore, the cooling part may be configured to be cooled by air introduced thereinto and discharged therefrom, and the lighting device may further include: a third power generation part including a rotating body which discharges wind in a vertical direction while being rotated by air flowing inside the cooling part, the third power generation part being configured to produce electrical energy by using a rotational force of the rotating body.

According to the present disclosure, the first power generation part produces electrical energy by power generation through solar heat during the day, the second power generation part produces electrical energy by power generation through heat generated from the LED module operating at night, and each of the first thermoelectric element and the second thermoelectric element included respectively in the first power generation part and the second power generation part maximizes temperature difference between high and low temperature parts due to the cooling part, thereby increasing power generation efficiency and maximizing an energy saving effect.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

In order to maximize an energy saving effect by generating electricity not only during the day but also at night by using power generation through solar heat and heat generated from an LED, the present disclosure proposes a lighting device using combined power generation including: a first power generation part comprising a first thermoelectric element whose first surface has a high temperature part formed by solar heat, the first power generation part being configured to generate electrical energy by using the first thermoelectric element; a second power generation part comprising a second thermoelectric element whose first surface has a high temperature part formed by heat generated from an LED module, the second power generation part being configured to generate electrical energy by using the second thermoelectric element; and a cooling part which is provided between the first power generation part and the second power generation part and simultaneously cools a second surface of each of the first thermoelectric element and the second thermoelectric element.

The scope of claims of the present disclosure is not limited to embodiments described below, and may be variously modified by those skilled in the art within the scope of the technical gist of the present disclosure.

Hereinafter, the lighting device using combined power generation according to the present disclosure will be described in detail with reference to FIGS. 1A to 5.

Figure 1A:
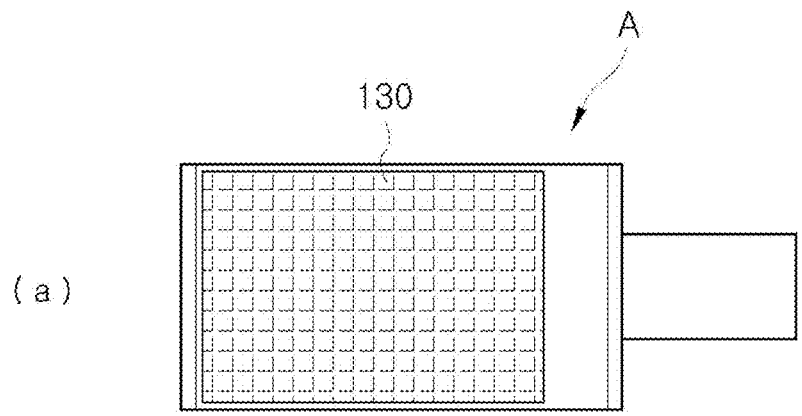
FIGS. 1A, 1B, and 1C are views illustrating appearances according to one example of a lighting device using combined power generation of the present disclosure.
Figure 1B:
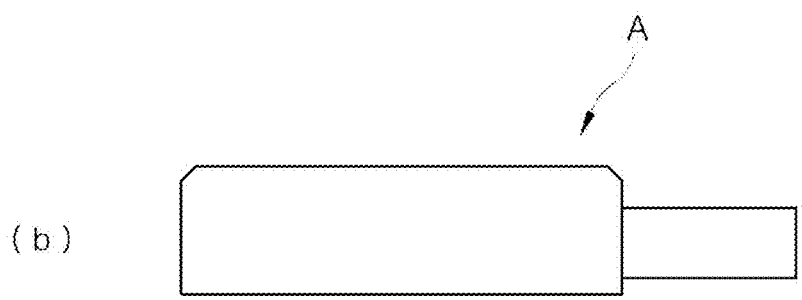
Figure 1C:
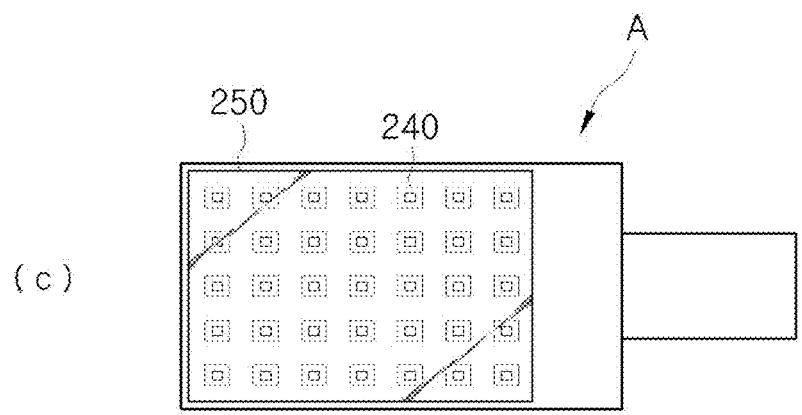

The lighting device A using combined power generation of the present disclosure may be applied to a street light, a park light, and a flood light, etc., and as illustrated in FIGS. 1A-1C, may be applied to a street light head so that electrical energy can be produced through combined power generation.

Figure 2:
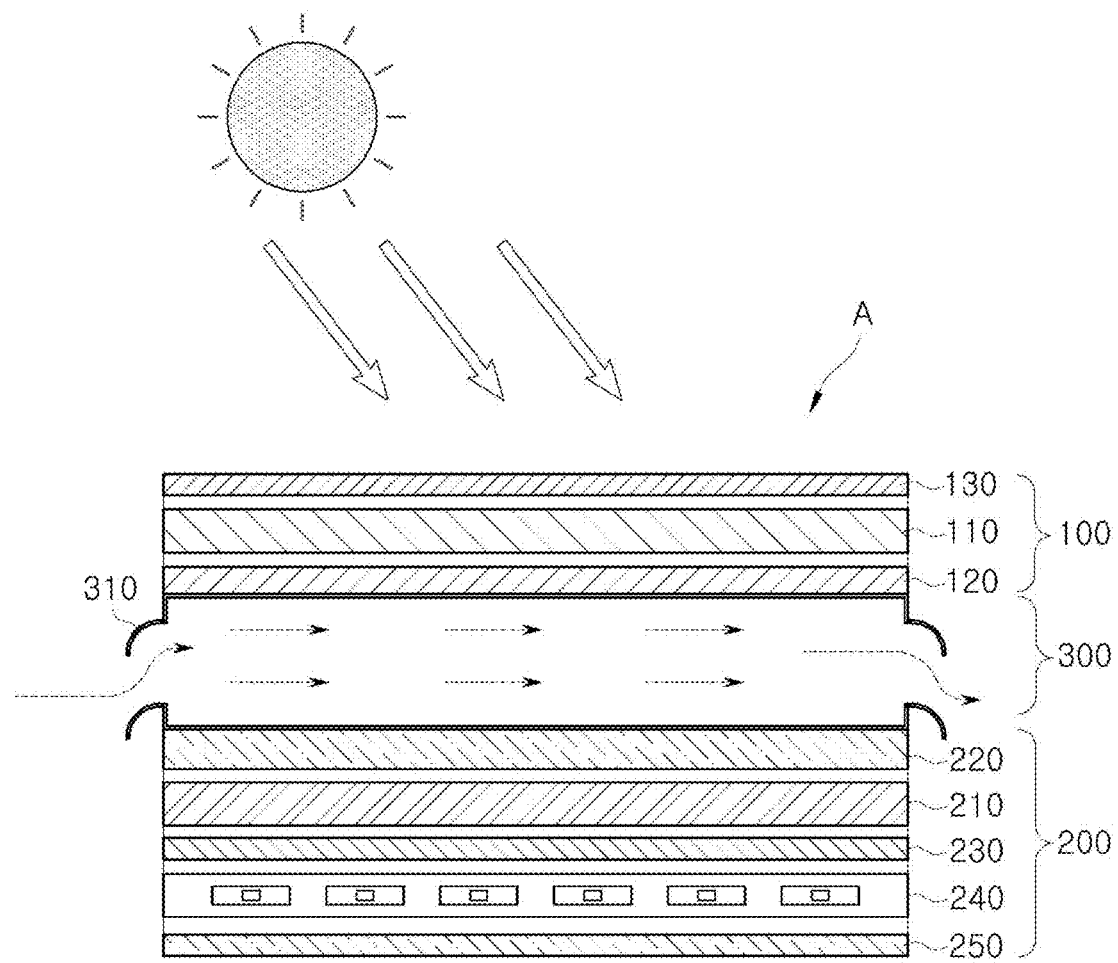
FIG. 2 is a view illustrating an internal structure of the lighting device using combined power generation of the present disclosure according to a first embodiment.
Figure 3:
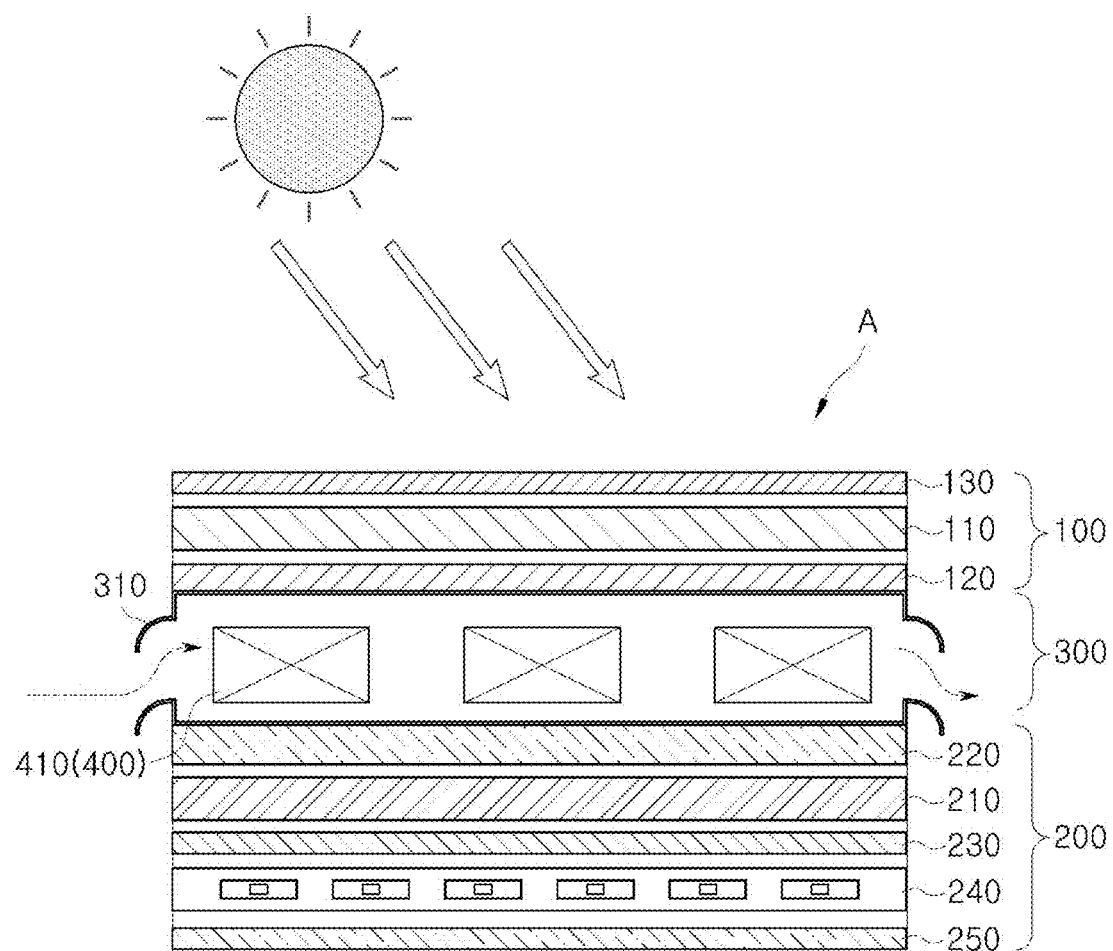
FIG. 3 is a view illustrating an internal structure of the lighting device using combined power generation of the present disclosure according to a second embodiment.
Figure 4A:
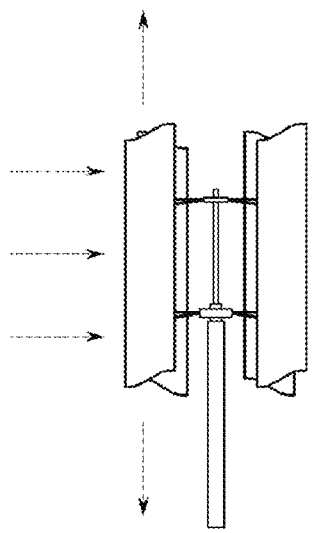
FIGS. 4A, 4B, and 4C are views illustrating examples of a rotating body applied to the lighting device using combined power generation of the present disclosure according to the second embodiment.
Figure 4B:
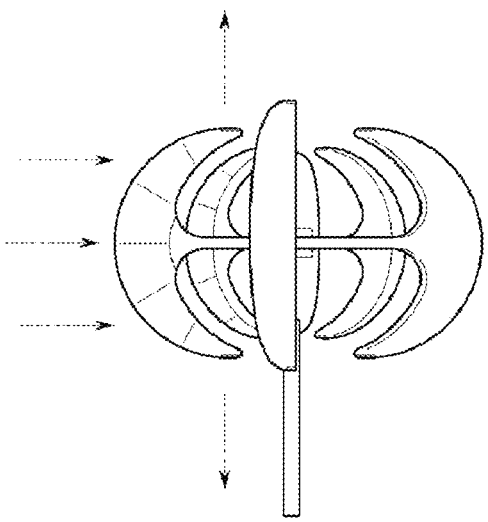
Figure 4C:
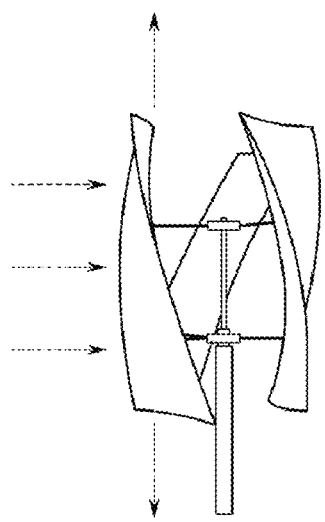

As illustrated in FIGS. 2 and 3, the lighting device A using combined power generation includes the first power generation part 100 and the second power generation part 200 which produce electrical energy, and the cooling part 300 provided between the first power generation part 100 and the second power generation part 200.

The first power generation part 100 includes the first thermoelectric element 110, and the first thermoelectric element 110 may be formed in a plate shape and may be disposed to be directed upward at the first surface of the first thermoelectric element 110 and to be directed downward at the second surface thereof. The first surface of the first thermoelectric element 110 is heated by solar heat to form the high temperature part, and the second surface of the first thermoelectric element 110 forms a relatively low temperature part with respect to the first surface. Accordingly, the first thermoelectric element 110 having temperature difference between the first surface and the second surface may include one or a plurality of thermoelectric elements according to a size thereof. When the plurality of thermoelectric elements is provided, the thermoelectric elements are preferably arranged on the same plane by being spaced apart from each other by a predetermined distance. Electrical energy is produced in the first power generation part 100 by the first thermoelectric element 110.

In addition, the first power generation part 100 may further include a component which forms large temperature difference between the high temperature part and the low temperature part of the first thermoelectric element 110. For example, as illustrated in FIGS. 2 and 3, the first power generation part 100 may further include a first cooling plate 120 configured such that the second surface of the first thermoelectric element 110 is located at an adjacent upper side of the first cooling plate 120 and the cooling part 300 is located at an adjacent lower side thereof. For a specific example, the first cooling plate 120 may be configured as a heat sink which discharges cold air upward.

The first cooling plate 120 is cooled by the cooling part 300, and the second surface of the first thermoelectric element 110 adjacent to the first cooling plate 120 forms the low temperature part having relatively large temperature difference from the first surface of the first thermoelectric element 110.

In addition, as illustrated in FIGS. 1A, 2, and 3, the first power generation part 100 may further include a first heat collection plate 130 which transmits heat received from the sun to the first surface of the first thermoelectric element 110. The first heat collection plate 130 is provided at an adjacent upper side of the first thermoelectric element 110 and collects heat from the sun and transmits the heat to the first surface of the first thermoelectric element 110 so that the first surface of the first thermoelectric element 110 effectively forms a relatively high temperature part compared to the second surface thereof.

When the first cooling plate 120 and the first heat collection plate 130 described above are all included in the first power generation part 100, temperature difference between the high temperature part and the low temperature part of the first thermoelectric element 110 may be maximized, and the large temperature difference of the first thermoelectric element 110 can be continuously maintained, thereby increasing power generation efficiency.

Meanwhile, the second power generation part 200 includes the LED module 240 and the second thermoelectric element 210.

The LED module 240 may be, for example, an LED substrate having one or a plurality of LEDs on one side thereof. When the LED module 240 is an LED substrate having a plurality of LEDs, the plurality of LEDs may be arranged by being spaced apart from each other by a predetermined distance. The LED module 240 may have one surface having the LEDs as illustrated in FIG. 1C disposed to be directed downward. In addition, a transparent window 250 for protecting the LED module 240 may be provided at an adjacent lower side of the LED module 240, and light emitted from the LEDs according to the operation of the LED module 240 may be emitted through the transparent window 250 to the outside.

The second thermoelectric element 210 may be formed in a plate shape and may be disposed to be directed downward at a first surface of the second thermoelectric element 210 and to be directed upward at a second surface thereof. The first surface of the second thermoelectric element 210 is heated by heat generated from the LED module 240 to form a high temperature part, and the second surface of the second thermoelectric element 210 forms a relatively low temperature part with respect to the first surface thereof. Accordingly, the second thermoelectric element 210 having temperature difference between the first surface and the second surface may include one or a plurality of thermoelectric elements according to a size thereof. When the plurality of thermoelectric elements is provided, the thermoelectric elements are preferably arranged on the same plane by being spaced apart from each other by a predetermined distance. Electrical energy is produced in the second power generation part 200 by the second thermoelectric element 210.

In addition, the second power generation part 200 may further include a component which forms large temperature difference between the high temperature part and the low temperature part of the second thermoelectric element 210. For example, as illustrated in FIGS. 2 and 3, the second power generation part 200 may further include a second cooling plate 220 configured such that the cooling part 300 is located at an adjacent upper side of the second cooling plate 220 and the second surface of the second thermoelectric element 210 is located at an adjacent lower side of the second cooling plate 220. For a specific example, the second cooling plate 220 may be configured as a heat sink which discharges cold air downward.

The second cooling plate 220 is cooled by the cooling part 300, and the second surface of the second thermoelectric element 210 adjacent to the second cooling plate 220 forms the low temperature part having relatively large temperature difference from the first surface of the second thermoelectric element 210.

In addition, as illustrated in FIGS. 2 and 3, the second power generation part 200 may further include a second heat collection plate 230 which transmits heat received from the LED module 240 to the first surface of the second thermoelectric element 210. The second heat collection plate 230 is provided between the first surface of the second thermoelectric element 210 and the LED module 240 and collects heat generated from the LED module 240 to transmit the heat to the first surface of the second thermoelectric element 210. The first surface of the second thermoelectric element 210 allows the high temperature part to be formed more effectively than the second surface of the second thermoelectric element 210.

When the second cooling plate 220 and the second heat collection plate 230 described above are all included in the second power generation part 200, temperature difference between the high temperature part and the low temperature part of the second thermoelectric element 210 may be maximized, and the large temperature difference of the second thermoelectric element 210 can be continuously maintained, thereby increasing power generation efficiency.

Meanwhile, as illustrated in FIGS. 2 and 3, the cooling part 300 is provided between the first power generation part 100 and the second power generation part 200 and simultaneously cools the second surface of each of the first thermoelectric element 110 and the second thermoelectric element 210. For example, the cooling part 300 may be configured in an air-cooling type or a water-cooling type, but the water-cooling type of cooling part has a relatively complex structure and a leakage risk compared to the air-cooling type of cooling part. Accordingly, the cooling part 300 of the present disclosure is preferably configured as the air-cooling type of cooling part.

Accordingly, the cooling part 300 may be configured to be cooled by the inflow and outflow of air. To this end, the cooling part 300 may be formed in the form of an empty container, and may have an inlet/outlet 310 formed in at least one side of the cooling part 300 so that air is introduced and discharged through the inlet/outlet 310. In this case, the inlet/outlet 310 may be formed by protruding to be inclined downward toward the outside. This is intended to inhibit rain or snow from being introduced into the cooling part 300 through the inlet/outlet 310 by considering that the lighting device A using combined power generation of the present disclosure is installed outside.

Preferably, the inlet and outlet 310 may be formed in the cooling part 300 so that the inlet and outlet 310 correspond to each other in directions facing each other. Accordingly, air may be introduced through the inlet 310 formed in a first side surface of the cooling part 300, and air may be discharged through the outlet 310 formed in a second side surface thereof facing the first side surface. The introduced air cools the second surface of each of the first thermoelectric element 110 and the second thermoelectric element 210 while passing through the cooling part 300.

As described above, the lighting device A using combined power generation according to the present disclosure generates electrical energy by power generation through solar heat by using the first power generation part 100 during the day, generates electrical energy by power generation through heat generated from the LED module 240 operated by the second power generation part 200 at night, and temperature difference between the high temperature part and low temperature part of each of the first thermoelectric element 110 and the second thermoelectric element 210 included respectively in the first power generation part 100 and the second power generation part 200 is maximized by the cooling part 300, thereby increasing power generation efficiency and maximizing an energy saving effect.

Meanwhile, as illustrated in FIG. 3, the lighting device of the present disclosure may further include a third power generation part 400 that produces electrical energy by using an air flow formed in the cooling part 300. As illustrated in FIGS. 3, 4A, 4B, and 4C, the third power generation part 400 may include a rotating body 410 which discharges wind in a vertical direction while being rotated by air flowing inside the cooling part 300, the third power generation part 400 being configured to produce electrical energy by using the rotational force of the rotating body 410.

The rotating body 410 may be configured such that a plurality of blades is provided on a shaft erected in the vertical direction of the cooling part 300. While the blades rotate when air flows from a first side of the cooling part 300 to a second side thereof, the blades may discharge wind in the vertical direction, that is, toward the first cooling plate 120 and the second cooling plate 220. That is, the rotating body 410 provides a rotational force by which electrical energy is produced and functions to cool the first cooling plate 120 and the second cooling plate 220 in a short time. Accordingly, the third power generation part 400 can not only produce additional electric energy, but also can further improve the power generation efficiency of the first power generation part 100 and the second power generation part 200.

Figure 5:
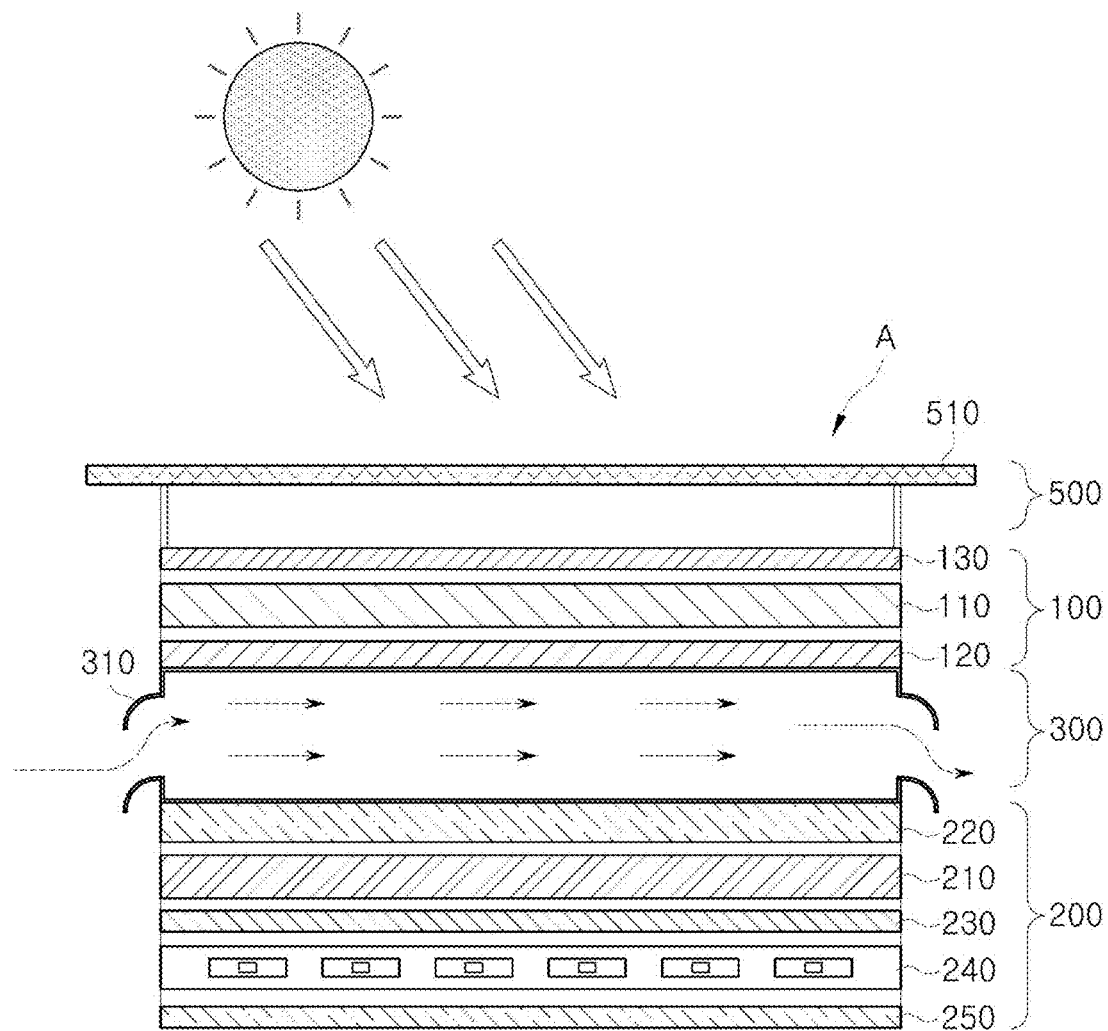
FIG. 5 is a view illustrating an internal structure of the lighting device using combined power generation of the present disclosure according to a third embodiment.

Meanwhile, as illustrated in FIG. 5, the lighting device of the present disclosure may further include a fourth power generation part 500 that generates electrical energy by using sunlight. The fourth power generation part 500 may include a solar cell panel 510 provided on the upper side of the first heat collection plate 130 as illustrated in FIG. 5. The solar cell panel 510 is illustrated horizontally in the drawing, but may be disposed to be inclined in one direction.

The solar cell panel 510 converts the light energy of the sun into electrical energy and absorbs solar heat, and thus indirectly transmits the solar heat to the first heat collection plate 130 provided under the solar cell panel 510. However, in this case, compared to when the first heat collection plate 130 directly receives solar heat, the production of electrical energy through the first power generation part 100 is reduced, but the amount of electrical energy produced through the fourth power generation part 500 is greater than the amount of the reduced production of the first power generation part 100, so higher power generation efficiency can be expected.

In addition, although not shown, the lighting device of the present disclosure may include a battery that stores electrical energy generated by each of the power generation parts 100, 200, 400, and 500, and may also include a converter so as to operate the LED module 240 by using electrical energy generated by each of the power generation parts 100, 200, 400, and 500.

What is claimed is:

1. A lighting device using combined power generation, the lighting device comprising:
    a first power generation part (100) comprising a first thermoelectric element (110) whose first surface has a high temperature part formed by solar heat, the first power generation part (100) being configured to generate electrical energy by using the first thermoelectric element (110);
    a second power generation part (200) comprising a second thermoelectric element (210) whose first surface has a high temperature part formed by heat generated from an LED module (240), the second power generation part (200) being configured to generate electrical energy by using the second thermoelectric element (210); and
    a cooling part (300) which is provided between the first power generation part (100) and the second power generation part (200) and simultaneously cools a second surface of each of the first thermoelectric element (110) and the second thermoelectric element (210),
    wherein the first power generation part (100) further comprises: a first cooling plate (120) configured such that the second surface of the first thermoelectric element (110) is located at an adjacent upper side of the first cooling plate (120) and the cooling part (300) is located at an adjacent lower side of the first cooling plate (120); and a first heat collection plate (130) which is provided at an upper side adjacent to the first thermoelectric element (110) and collects heat from the sun,
    the second power generation part (200) further comprises: a second cooling plate (220) configured such that the cooling part (300) is located at an adjacent upper side of the second cooling plate (220) and the second surface of the second thermoelectric element (210) is located at an adjacent lower side of the second cooling plate (220); and a second heat collection plate (230) which is provided between the first surface of the second thermoelectric element (210) and the LED module (240) and collects heat generated from the LED module (240),
    in the cooling part (300), inlet and outlet (310) through which air is introduced and discharged are formed correspondingly in directions facing each other and cooling is performed by air introduced through a first side of the cooling part (300) from the outside and discharged through a second side thereof to the outside, and
    the lighting device further comprises a third power generation part (500) that generates electrical energy by using sunlight.

2. The lighting device of claim 1, wherein each of the inlet and outlet (310) is formed by protruding to be inclined downward toward the outside.

3. The lighting device of claim 1, further comprising:
    a fourth power generation part (400) comprising a rotating body (410) which discharges wind in a vertical direction while being rotated by air flowing inside the cooling part (300), the fourth power generation part (400) being configured to produce electrical energy by using a rotational force of the rotating body (410).

\* \* \* \* \*

UNITED STATES PATENT AND TRADEMARK OFFICE
CERTIFICATE OF CORRECTION

PATENT NO. : 12,442,523 B2
APPLICATION NO. : 18/305870
DATED : October 14, 2025
INVENTOR(S) : Ok Ja Jeon et al.

It is certified that error appears in the above-identified patent and that said Letters Patent is hereby corrected as shown below:

In the Claims

Column 8,
Line 27, Claim 1, "a third power" should read --a solar power--.

Column 8,
Line 34, Claim 3, "a fourth power" should read --a rotating body power--.

Column 8,
Line 37, Claim 3, "the fourth power" should read --the rotating body power--.

Signed and Sealed this
Twenty-third Day of December, 2025

John A. Squires
*Director of the United States Patent and Trademark Office*